United States Patent [19]

Prophit

[11] Patent Number: 4,567,959

[45] Date of Patent: Feb. 4, 1986

[54] SPEAKER ADAPTED TO CORNER-LOADED INSTALLATION

[76] Inventor: David A. Prophit, 10488 Blackwater Rd., Baker, La. 70714

[21] Appl. No.: 721,555

[22] Filed: Apr. 10, 1985

[51] Int. Cl.[4] .................... H05K 5/00

[52] U.S. Cl. .................... 181/156; 181/153; 181/141; 381/86

[58] Field of Search .................... 181/141, 153, 156, 196, 181/197; 381/86

[56] References Cited

U.S. PATENT DOCUMENTS

| | | | |
|---|---|---|---|
| 2,880,817 | 4/1959 | Burns et al. | 181/156 |
| 4,085,289 | 4/1978 | Schmideler | 181/153 X |

*Primary Examiner*—Benjamin R. Fuller

*Attorney, Agent, or Firm*—Keaty & Keaty

[57] ABSTRACT

A limited space, small enclosure bass speaker module is shown, for providing an enhanced perception and sound level of bass frequencies. An acoustic transducer is mounted on an end of a closed elongated, cylindrical member of rigid construction. The cylinder provides acoustic loading of the transducer, and can be either an acoustic suspension or a bass reflex form; the bass reflex form has the bass reflex port located coplanar to the transducer. The resulting structure is a an oriented point source. The module is then acoustically coupled to its surroundings by being mounted so that the transducer face is in a corner. The result is to convert the surrounding environment into one element of a horn loaded speaker, producing an enhanced bass effect.

5 Claims, 6 Drawing Figures

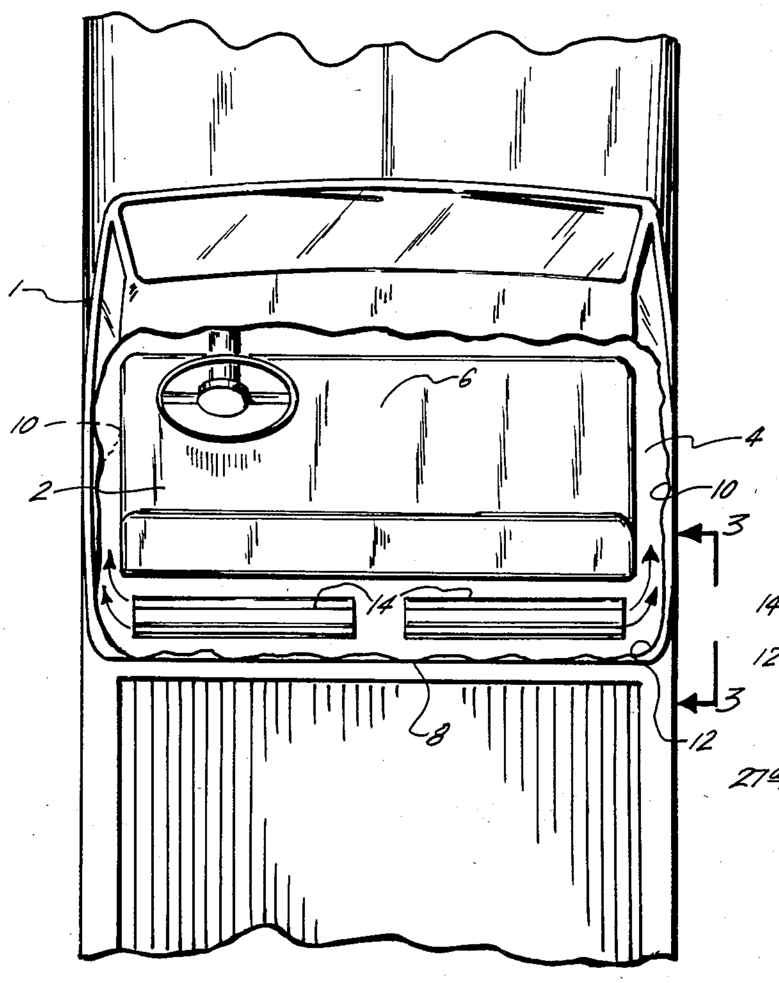
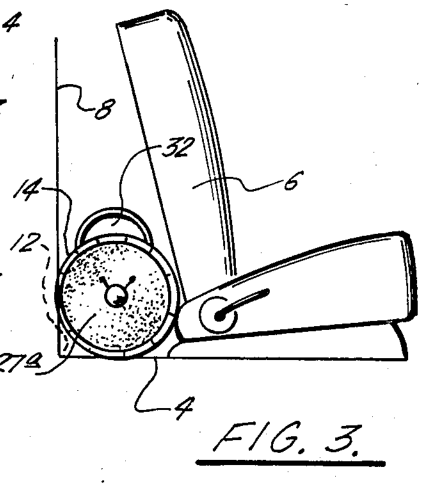
FIG. 3.
FIG. 2.
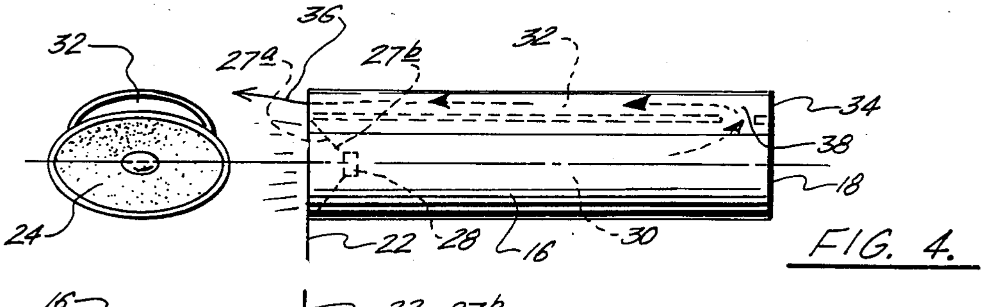
FIG. 4.
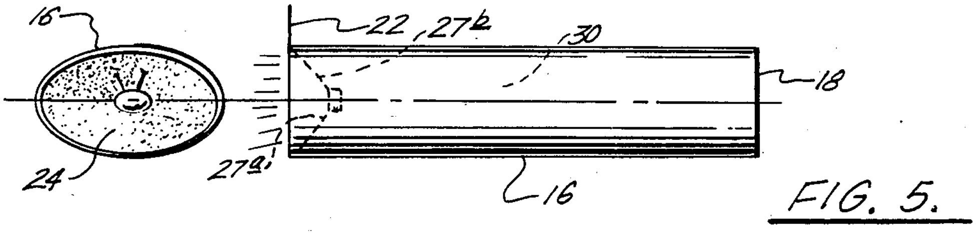
FIG. 5.

SPEAKER ADAPTED TO CORNER-LOADED INSTALLATION

BACKGROUND OF THE INVENTION

The development of speakers for production of high fidelity sound has led to the development of a series of speaker designs, each optimized to a particular sound range. Such speakers are then combined to form multi-way systems for the production of a complete audio spectrum for the reproduction of music and other wide band sound sources. The mechanical requirements of these speakers differ, and are heavily affected by the acoustical qualities of the environment or room in which the speakers are used.

The current invention is in the field of apparatti concerned with development of maximum volume of clean, solid low bass. The simplest method known to produce bass is to mount the driver to a sealed enclosure, called acoustic suspension. The major drawbacks of this design are inefficiency and muddy sounding or distorted bass, both of which are overcome by the next most common design found in the industry.

This alternative system is known as the bass reflex speaker system. In this system, a speaker or sound transducer consisting of a cone affixed to an electromagnetic driver is coupled through the front directly into the sound space or the sound environment. The back of the speaker cone is coupled through a tuned chamber, further coupled to a bass emitting port. The resulting structure provides a higher efficiency in terms of conversion of electrical power into acoustic power in the low-bass region.

In each case the prior art speakers are designed as essentially free standing units without space limitations. That is, the speakers are so directed as to be aimed into the primary listening area. Generally, in practice, the bass speakers are integrated mechanically and electrically with other speakers of higher frequency ranges to create a unitized, multi-way speaker system. The resulting cabinet structures have proven especially unsatisfactory in the field of automotive high fidelity, since, in general, the inside of an automotive body is a relatively small acoustical environment. Free standing speaker systems, by contrast, require acoustical environments which are very large with respect to the size of the speaker enclosure.

SUMMARY OF THE INVENTION

Disclosed herein is a novel structure for a bass module designed to be used in a specific manner as a compact cornerloading unit. In practice, for stereo application, two such module units are employed. Each is placed into a chosen corner of the environment where the bass is intended to be created. Each unit is used as part of at least a two-way speaker system, wherein separate speakers provide mid-range and high frequency sounds.

A preferred embodiment is disclosed wherein the unit is shown to be particularly adapted to being installed in the cab of a pick-up truck. In this usage, two units are employed, loading the opposite corners along the rear cab wall of the truck behind the seating area.

The structure shown is of a particularly useful shape for such employment, being an elongated tubular body as opposed to the generally bulky structure of ordinary bass speakers.

The structure further provides an enhanced bass effect with a much smaller active speaker unit than heretofore has been possible. In the preferred embodiment disclosed as an example, an active six inch diameter round speaker unit provides the same bass output as an 8 inch acoustic suspension speaker driven with some power.

The disclosed unit is an active speaker transducer of standard design mounted facing outward at one end of an elongated pipe structure having an outside diameter equal to that of the driver. The elongated chamber is closed at the end opposite the speaker and may be ported at the closed end into a vent member which extends adjacent to and in the direction of the long axis of the main chamber, terminating co-planar with the front face of the speaker. It may equally well be a closed chamber, providing acoustic suspension loading. Either configuration combines accoustic outputs so that the entire bass energy generated emanates from virtually one point. The entire assembly is acoustically loaded by placing the elongated tube in such a manner that the speaker face plane end is approximately three inches from the facing wall of a corner formed by the joining of three essentially mutually perpendicular wall members within the environment within which the bass is to be generated. When so installed, the structure provides considerably greater bass than that of an ordinary free standing acoustic suspension or bass reflex speaker. The shape of the unit is such that it may be conveniently installed in areas in which a conventional system or structure will not fit.

It is thus an object of this invention to disclose a bass module unit which may be combined in a multiway speaker system to provide an enhanced bass sound reproduction capability over that of alternate designs using active speaker elements of an identical size and power handling capability.

It is a further object of this invention to disclose a base module unit having a considerably enhanced bass sound effect within a limited environment than that provided by either an acoustic suspension or a free space bass reflex speaker system.

It is a further object to develop a bass reproducer that would fit conveniently behind the seats of small foreign pick-up trucks making maximum use of the limited space available.

It is a further object to provide a system which will maximize bass audio power output for any given input.

It is a further object to provide the above capabilities in an apparatus which is simple, easy to manufacture, moisture resistant and cost efficient.

This and other objects of the invention will be more clearly seen in the detailed description of the preferred embodiment which follows.

BRIEF DESCRIPTION OF THE DRAWINGS

FIG. 2 shows, in top view, a preferred installation of the invention.

FIG. 3 shows a side view of FIG. 2.

FIG. 4 shows an alternate embodiment of the invention.

FIGS. 5 and 6 show an alternate, acoustic suspension embodiment of the invention.

DETAILED DESCRIPTION OF THE PREFERRED EMBODIMENT

Figure 6:
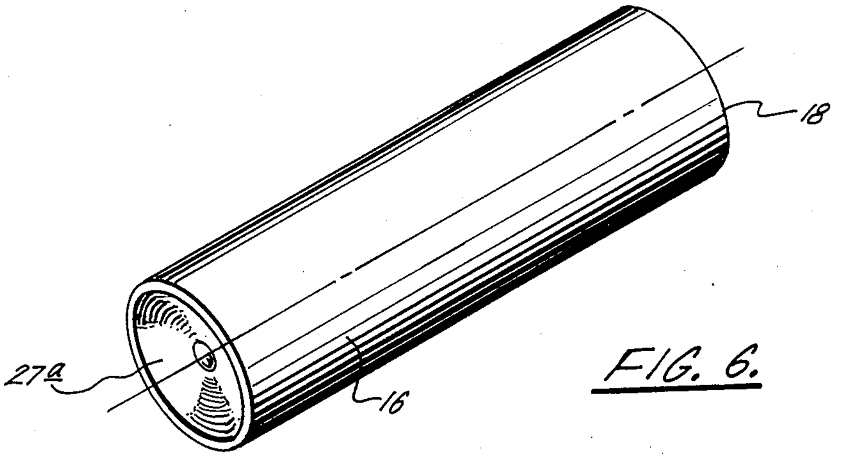

FIG. 2 shows a particular example, in this case a figurative truck cab 1, of the environment in which the inventive bass module speaker 14 is used. As is typical of most such listening environments, truck cab 1 is seen to have a generally flat floor section 4, joined with a back wall 8 and side walls 10 to form two bottm rear corners 12.

Figure 1:
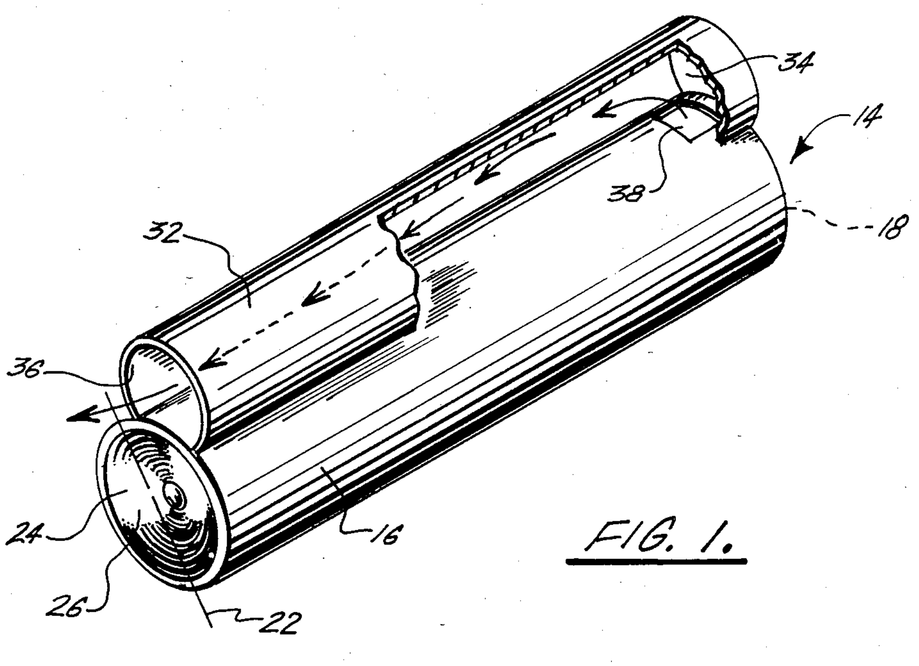
FIG. 1 shows an angled, cut-a-way view of the preferred bass reflex embodiment of the invention.

Turning to FIG. 1, showing the preferred embodiment of the invention, the inventive bass module 14 is seen to comprise a principal member, elongated tube member 16, having a closed end 18 and open end 20. Open end 20 defines a face plane 22, perpendicular to the longitudinal axis of the elongated tube 16.

Open end 20 is sealingly closed by a driver 24 of standard design. Driver/Speaker 24 comprises an acoustical energy generating cone 26 driven into vibration by a standard electromagnetic circuit member 28 of common construction, the member 28 best being seen in FIG. 4 of the alternate embodiment. Audio electrical signals from a standard amplifier, not shown, applied to the electromagnetic member 28 vibrate cone 26 creating acoustical or sound energy. This acoustical energy is directly radiated from the cone face 27A, and emanates from the face plane 22 of the bass module 14. Useful acoustical energy emanating from the cone rear 27B, or rear face of the cone 26, is contained within the elongated chamber member 16. In the preferred embodiment the tube chamber 16 is formed of a high density polyvinylchloride or other stiff, rigid material. The circular cross-section of chamber 16 thereby offers maximum internal volume for any given external module size.

Tube 16 between the closed end 18 and the cone rear face 27B defines an acoustical chamber 30 (both embodiments).

Coupled to, and extending parallel to the elongated tube member 16 is found a bass reflex duct means 32 which has a closed end 34 adjacent closed end 18 of the elongated tube 16 and an open end 36 adjacent to face plane 22 of bass module 14. As with elongated tube 16, duct 32 is constructed of a rigid material, in the preferred embodiment polyvinylchloride;

Duct 32 is acoustically coupled to chamber 30 solely through port 38. Port 38 is located adjacent to the intermediate closed end 34 of duct 32 and closed end 18 of the chamber 30. Port 38 provides the only coupling for acoustical or sound energy between chamber 30, driven by speaker 24, and reflex duct chamber 32.

The relative size of the chamber 30 and duct 32 are determined by a desired enclosure resonance frequency for the module 14. In the preferred embodiment, this is established by the following formula:

$$L_v = \frac{2700\,A_v}{V_b f_b^2} - .83\sqrt{A_v}$$

Where $L_v$=Duct 32 length in inches $V_b$=Chamber 30 volume in cubic feet;

$f_b$=the Chamber 30 resonant frequency tuning in Hertz;

$A_v$=the cross section of the Duct 32 in square inches.

In the preferred embodiment shown in FIG. 2 the bass module 14 is mounted so that the face plane 22 is acoustically coupled to the corner 12 of the truck cab environment 2.

As was stated, truck cab 2 is a particular environment, typical of most automotive listening environments in the sense that it has a defined bottom area or floor 4, back wall 8, and side walls 10, each more or less planar and therefore defining at a mutual joining point, rear corners 12. A seat 6 extends parallel to wall 8, defining a major physical restriction on the placement of modules 14.

Bass module 14 functions by acoustical coupling into corner 12, and thus is designed to function only in combination with corner 12. Thus it is considered that the invention is a speaker module adapted to corner loaded installation. In the preferred embodiment the bass module 14 is oriented such that the elongated tube member is essentially parallel to and adjacent both back wall 8 and floor 4; more importantly, face plane 22 is located about three inches from the side walls 10.

The particular space available within which bass module 14 is coupled to the corner 12 determines the overall size of bass module 14 and thus the physical sizes calculated by the aforesaid formula. In particular, within truck cabs, the design process starts by determining the low frequency cutoff desired for the bass module's acoustic response. Typical music is such that it is desirable that the lowest common note that should be reproduced, is low F (43.65 Hertz); thus the preferred embodiment is designed to achieve a 44 cycle cutoff, and a smoothly enchanced bass response above this cutoff extending into the mid range frequencies which will be reproduced by other elements of a multiway speaker system (not shown) of which the bass module 14 comprises but a part. In this case a 44 cycle cutoff is produced by designing for a free-space enclosure resonance of 45 Hertz. The particular inventive form shown for this resonant enclosure, that is the elongated tube 16 and parallel reflex duct 32, make tube 16 resonance the primary determinant of the bass frequency response and cut off when the unit 14 is installed in the corner-loaded relationship described.

Therefore, in the particular preferred embodiment concerned neither the speaker resonance, nor the enclosure resonance, are the determining factors as to the ultimate bass response. In particular, the size constraints imposed by behind-the-seat 6 spacing are such that it is most desirable to use a relatively small diameter speaker 24. The described invention can achieve a 44 Hertz (Low F) response when designed according to the formula stated, while maintaining a small diameter enclosure/module.

Thus it is found that the particular bass module 14 of the invention as described provides a significantly enchanced bass response while utilizing a speaker 24 within an enclosure of much smaller dimensions than has heretofore been practical using free space bass speakers of either the acoustic suspension or the bass reflex design.

It is not necessary in the design of the invention that the speaker be round nor is it necessary that the vent port be oriented on only one side of the elongated tube 16. Thus an alternate version is theoretically possible in which the vent chamber 32 would be coaxially disposed around the elongated tube 16. Space limitations imposed by typical environments rule out the use of this configuration (see FIG. 3).

In addition, FIG. 4 and FIG. 5 show that the invention is equally capable of realization using oval or otherwise noncircular speakers, so long as the basic resonance conditions and generally elongated shape of tube 16 are preserved. Reference numerals in the alternate embodiments shown in FIGS. 4, 5 and 6 refer to the correspondingly numbered parts in FIGS. 1, 2 and 3.

It can thus be seen, from the description of the preferred embodiment above and the variants known by the inventor to be of equal effect, that the invention is restricted not to the specific preferred embodiment described for truck cabs but rather to that wide range of equivalents claimed below.

I claim:

1. A bass module speaker for providing enchanced bass response within an environment space having corners, comprising:

an elongated hollow tube member having a closed and an open end;

electro-acoustic driver means sealingly mounted in said open end;

a reflex duct extending longitudinally along an exterior side of said elongated tube member extending from said closed end to said open end;

said duct having a closed end adjacent to the closed end of said tube;

said duct being connected acoustically to said tube through a port intermediate said duct and said tube member adjacent said closed ends; and said port having an open end face in the plane of said electro-acoustic driver means.

2. Apparatus as described in claim 1 above further comprising:

said driver means defining a front face plane of said tube means; and said tube member being located adjacent a corner of the environment, said defined plane being parallel to an adjacent wall of said corner.

3. The apparatus as described in claim 2 above wherein said front face plane is located approximately three inches from said wall.

4. The apparatus as described in claim 1 above wherein said tube member and said duct, as acoustically coupled through said port, have a free-space reflex resonance of approximately 45 Hertz.

5. The apparatus as described in claim 1 above wherein said speaker has a cone resonance above 70 Hertz.

* * * * *

UNITED STATES PATENT AND TRADEMARK OFFICE
CERTIFICATE OF CORRECTION

PATENT NO. : 4,567,959

DATED : February 4, 1986

INVENTOR(S) : David A. Prophit

It is certified that error appears in the above-identified patent and that said Letters Patent is hereby corrected as shown below:

In claim 1, at column 6, lines 2 and 3, after the word "tube", insert --member--; at column 6, line 6, delete "port" and substitute --duct--.

In claim 2, at column 6, line 11, delete "means" and substitute --member--; at column 6, line 13, after the word "environment", insert --space--.

Signed and Sealed this

Eighteenth Day of January, 1994

Attest:

BRUCE LEHMAN

Attesting Officer

Commissioner of Patents and Trademarks